United States Patent
Takeya

(10) Patent No.: US 9,015,935 B2
(45) Date of Patent: Apr. 28, 2015

(54) METHOD FOR MANUFACTURING PROBE CARD

(75) Inventor: Toshinaga Takeya, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 925 days.

(21) Appl. No.: 13/182,254

(22) Filed: Jul. 13, 2011

(65) Prior Publication Data

US 2012/0042509 A1 Feb. 23, 2012

(30) Foreign Application Priority Data

Aug. 19, 2010 (JP) ................................. 2010-183660

(51) Int. Cl.
*H05K 3/30* (2006.01)
*H05K 3/00* (2006.01)
*G01R 31/00* (2006.01)
*G01R 3/00* (2006.01)

(52) U.S. Cl.
CPC .............. *G01R 3/00* (2013.01); *Y10T 29/49124* (2015.01)

(58) Field of Classification Search
CPC .................. H05K 3/3447; H01L 2924/01079; G01R 1/07342; G01R 1/07378
USPC .......................... 29/837, 829, 832; 324/756.03
See application file for complete search history.

(56) References Cited

U.S. PATENT DOCUMENTS

| 3,952,410 | A | * | 4/1976 | Garretson et al. | 29/834 |
| 4,623,839 | A | * | 11/1986 | Garretson et al. | 324/750.25 |
| 5,066,907 | A | * | 11/1991 | Tarzwell et al. | 324/750.25 |
| 5,309,327 | A | * | 5/1994 | Slater | 361/805 |
| 7,219,418 | B2 | * | 5/2007 | Byrd | 29/623 |
| 7,948,252 | B2 | * | 5/2011 | Grube et al. | 324/754.07 |
| 8,310,259 | B2 | * | 11/2012 | Hamel et al. | 324/756.03 |
| 8,373,428 | B2 | * | 2/2013 | Eldridge et al. | 324/754.14 |
| 8,427,183 | B2 | * | 4/2013 | Mathieu et al. | 324/750.16 |
| 8,485,418 | B2 | * | 7/2013 | Eldridge et al. | 228/179.1 |
| 2005/0258847 | A1 | * | 11/2005 | Narazaki et al. | 324/754 |

FOREIGN PATENT DOCUMENTS

| JP | 2009-162483 | | 7/2009 |
| JP | 2009162483 | * | 7/2009 |

* cited by examiner

*Primary Examiner* — David Angwin
(74) *Attorney, Agent, or Firm* — Ingrassia Fisher & Lorenz, P.C.

(57) ABSTRACT

A method for manufacturing a probe card includes inserting an attaching portion of each probe into one of first through holes provided on a probe substrate at least in a row, inserting a probe tip portion of each probe into second through holes respectively provided on a plurality of plate-like positioning members piled in their thickness directions at least in a row, relatively displacing the adjacent positioning members in opposite directions to two-dimensionally position the probe tip portions of the probes, and thereafter softening a conductive jointing material to position the attaching portions of the respective probes against the first through holes.

10 Claims, 21 Drawing Sheets

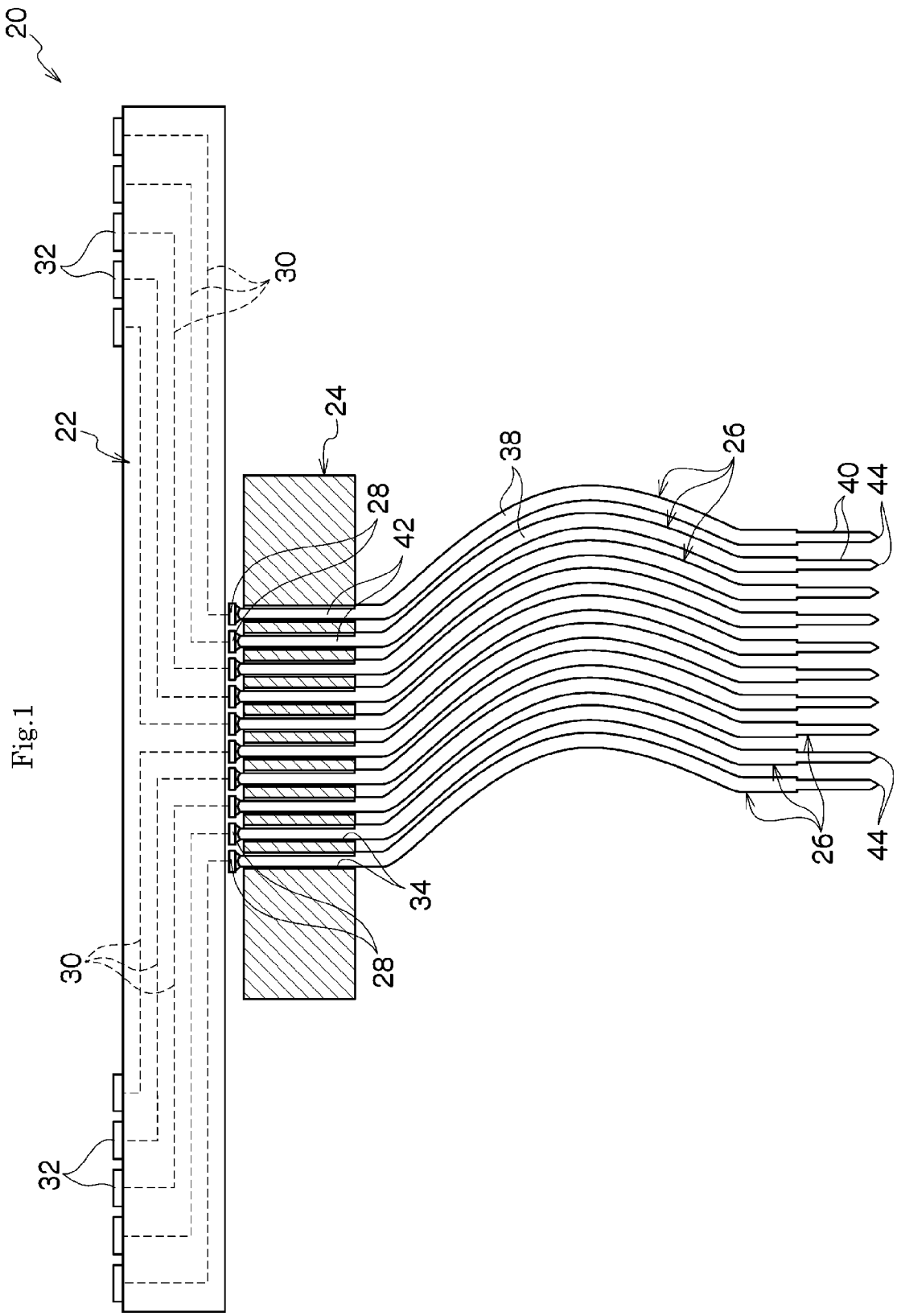

METHOD FOR MANUFACTURING PROBE CARD

PRIORITY CLAIM

The instant application claims priority to Japanese Patent Application No. 2010-183660, filed Aug. 19, 2010, which application is incorporated herein by reference in its entirely.

TECHNICAL FIELD

The embodiment of the subject matter relates to a method for manufacturing a probe card for use in an electrical test of a flat-plate-shaped device under test such as an integrated circuit.

BACKGROUND

Multiple integrated circuits formed on a semiconductor wafer undergo an inspection or a test to determine whether or not they have functions in accordance with the specification before being separated from the wafer. The multiple integrated circuits on one wafer are tested simultaneously at a time or in several batches. An example of a probe card to be used in a test of this kind is a vertical one with use of plural bar-like probes (Patent Document 1).

This known probe card includes a probe assembly having a supporting frame coupling an upper plate and a lower plate each having a plurality of through holes in a state of being spaced in an up-down direction and a plurality of probes passing through the through holes of the upper plate and the lower plate at their upper portions and lower portions. This probe assembly is attached to the lower side of a supporting substrate in a state where the probes extend downward.

An upper end of each probe is thrust on a connecting portion such as an end portion of a wire inserted in a through hole of the supporting substrate or a probe land provided on the lower surface of the supporting substrate and the supporting substrate. Also, as for each probe, its lower end portion is locked on the lower plate to be prevented from falling and passes through a through hole of the lower plate so as for a lower end (that is, a probe tip) to be positioned two-dimensionally. In this conventional art, the upper plate functions as a probe substrate while combination of the supporting frame and probes functions as a probe assembly.

However, in the above conventional probe card, since the upper end portion of each probe is just inserted in the through hole of the upper plate and is just thrust on the connecting portion on the supporting substrate, the upper end portion of each probe is unstable against the upper plate, the lower plate, and the supporting substrate due to looseness between the upper plate or lower plate and the probes. As a result, a relative position among the probe tips changes. Such a probe card cannot arrange the probes in a high-density manner.

CITATION LIST

Patent Document 1: Japanese Patent Appln. Public Disclosure No. 2009-162483

SUMMARY

It is an object of the embodiment of the subject matter to fix probes in a probe substrate in a state where relative positions of probe tips of the plurality of probes are positioned.

The embodiment of the subject matter is basically characterized in that a method for manufacturing a probe card comprises the following steps.

A first step of preparing a probe substrate, a plurality of probes each having an attaching portion and a probe tip portion, and plate-like first and second positioning members collaboratively positioning relative positions of the probe tip portions of the plurality of probes, wherein the first and second positioning members respectively have a plurality of first and second through holes that penetrate the respective positioning members in their thickness directions and in which the probe tip portions can be inserted and can perform parallel movement relatively between an inserting position at which the mutually corresponding first and second through holes are communicated and at which insertion of the probe tip portions of the corresponding probes is allowed in a state where the first and second positioning members are piled on each other and a clamping position at which edge portions of the first and second through holes collaboratively clamp the probe tip portions in a state where the probe tip portions are inserted in the first and second through holes.

A second step including placing the first and second positioning members at the inserting position and inserting the probe tip portions of the corresponding probes into the first and second through holes of the first and second positioning members placed in the inserting position.

A third step of making the first and second positioning members perform parallel movement relatively from the inserting position to the clamping position in a state where the probe tip portions are inserted in the first and second through holes to position the relative positions of the plurality of probe tip portions.

A fourth step of fixing the attaching portions of the probes in relation to the probe substrate to hold the probes in the probe substrate in a state where the probe tip portions are clamped by the first and second positioning members.

Each of the attaching portions may be formed in a columnar shape having a circumferential surface, and the probe substrate may have a plurality of third through holes penetrating in its thickness direction and allowing insertion of the attaching portions of the probes. The first step may include forming a metal layer having higher wettability than that of the attaching portion at a part of the circumferential surface of the probe and forming a layer of a hot-melt material to cover the metal layer and at least a part of the circumferential surface exposed from the metal layer.

The above method for manufacturing a probe card may further comprise, between the first step and the second step, a fifth step including inserting the attaching portion of each of the plurality of probes into each of the plurality of third through holes of the probe substrate so that at least a part of the metal layer may be located in the third through hole and melting the hot-melt material of each attaching portion and thereafter solidifying the hot-melt material in a state where the hot-melt material contacts the part of the metal layer and a part of a wall surface of the third through hole to temporarily hold each probe in the probe substrate.

The fourth step may include, in a state where each of the probe tip portions is clamped by the first and second positioning members, melting the hot-melt material solidified in the fifth step and thereafter solidifying the hot-melt material in a state where the hot-melt material contacts the part of the metal layer and the part of the wall surface of the third through hole to fix the probe to the probe substrate.

The above method for manufacturing a probe card may further comprising a sixth step including preparing a wiring board with a plurality of coupling portions formed on one surface thereof, arranging the probe substrate on the one surface of the wiring board, and jointing one end portions of the attaching portions projecting from the third through holes to the corresponding coupling portions formed on the wiring board and a seventh step for removing the positioning members from the probes after the sixth step.

The above method for manufacturing a probe card may further comprising the sixth step for removing the positioning members from the probes after the fourth step, and a seventh step including preparing a wiring board with a plurality of jointing portions formed on one surface thereof, arranging the probe substrate on the one surface of the wiring board, and jointing the one end portions of the attaching portions projecting from the third through holes to the corresponding coupling portions formed on the wiring board.

A method for manufacturing a probe card according to the embodiment of the subject matter comprises the following steps.

A first step of manufacturing a plurality of bar-like probes, wherein each probe has a probe main body portion extending in an up-down direction, a probe tip portion extending downward from a lower end of the probe main body portion, an attaching portion extending upward from an upper end of the probe main body portion, and a layer of a conductive jointing material provided on an outer surface of an upper portion of the attaching portion.

A second step including preparing a probe substrate having a plurality of first through holes penetrating in its up-down direction and arrayed on the probe substrate at least in a row and inserting the attaching portion of each of the plurality of probes into the corresponding first through hole.

A third step including inserting the probe tip portions of the corresponding probes into second through holes provided respectively on at least two plate-like positioning members piled in their thickness directions at least in a row and thereafter relatively displacing the adjacent positioning members to two-dimensionally position the probe tip portions of the probes against the probe substrate.

A fourth step of softening the conductive jointing material to eliminate a stress that may be generated in the probes by positioning of the probe tip portions of the probes against the probe substrate to position the attaching portions of the respective probes against the first through holes.

The method according to the embodiment of the subject matter may further comprise, after the second step, a fifth step of melting the jointing material and solidifying the molten jointing material to fix the attaching portion of each probe in the first through hole of the probe substrate.

The probe tip portion of each probe and each second through hole of each positioning member may have rectangular cross-sectional shapes, and the third step may include piling the adjacent positioning members so that the corresponding second through holes of the adjacent positioning members may be aligned to one another and relatively displacing the adjacent positioning members in a diagonal direction of the rectangle of the second through hole to maintain the adjacent positioning members in a state where the rectangle of the probe tip portion and each communicating part of the second through holes of the adjacent positioning members are in equal shapes, and where the probe tip portion is clamped by edge portions of the second through holes.

Each probe may have at a border between the probe main body portion and the probe tip portion a step abutting on an outer edge of the second through hole of the positioning member when the probe tip portion is inserted into the corresponding second through holes.

The first step may include manufacturing a probe plate, the probe plate may have the plurality of probes and a tab integrally coupling the probes and detachable from each probe at the proximity of the probe tip portion of each probe, and the third step may include separating the tab from each probe before the probe tip portion is inserted in the second through holes.

Each probe may have a leading portion extending upward from the upper portion of the attaching portion, inserting the attaching portion into the first through hole may include inserting the attaching portion of each probe into the first through hole from a side of the leading portion, and the method according to the embodiment of the subject matter may further comprise, after the second step, a step of removing the leading portion of the probe from the attaching portion, and after the fourth step, a step of removing the positioning members from the probes.

The plurality of first through holes may be arrayed in plural rows, the first step may include manufacturing a plurality of probe plates, each probe plate may have the plurality of probes and a tab integrally coupling the probes and detachable from each probe at the proximity of the probe tip portion of each probe, and the third step may include separating the tab from each probe before the probe tip portion is inserted in the second through holes.

The method according to the embodiment of the subject matter may further comprise a sixth step including arranging the probe substrate on one surface of a wiring board and jointing the upper portions of the attaching portions projecting from the first through holes to a plurality of coupling portions formed on the one surface of the wiring board.

Each probe may have at a border between the probe main body portion and the attaching portion a step abutting on an outer edge of the first through hole of the probe substrate when the attaching portion is inserted into the first through hole. Also, the probe main body portion of each probe may have a curve bent or curved in an equal direction.

In the embodiment of the subject matter, in order to hold the probes in the probe substrate, the first and second positioning members are made to perform parallel movement relatively from the inserting position to the clamping position in a state where the probe tip portions are inserted in the first and second through holes to position the relative positions of the probe tip portions of the plurality of probes, and the probe tip portions are clamped by the first and second positioning members. Thus, the plurality of probes are held in the positioning members in a state where the relative positions of the probe tips of the plurality of probes are positioned. Consequently, with the embodiment of the subject matter, it is possible to fix in the probe substrate the plurality of probes held so that the relative positions of the probe tips may be positioned.

That is, in the embodiment of the subject matter, since the jointing material is softened in a state where the probe tip portions of the probes are positioned two-dimensionally by the positioning members, the attaching portions of the respective probes can be displaced against the first through holes by deforming the jointing material. Thus, even in a case where a stress such as a strain is effected to the probes by the probe substrate and the positioning members and remains in the probes due to positioning of the probe tip portions by the positioning members, such a stress is eliminated as the attaching portions are displaced against the first through holes along with softening of the jointing material. Consequently, with the embodiment of the subject matter, the probes are held by the positioning members in a state where the relative positions of the probe tips of the probes are positioned, and the probes can be fixed in the probe substrate in the state.

In a case where each second through hole and the probe tip portion inserted in the second through hole have rectangular cross-sectional shapes, the adjacent positioning members are piled so that diagonal directions of the rectangles of the second through holes may be aligned, and these positioning members are relatively displaced in the diagonal directions, the probe tip portions of the probes are moved accurately and reliably along with the relative displacement of the positioning members. Consequently, two-dimensional positions of the probe tips of the probes can be positioned easily and accurately.

Since the plurality of probes have the steps that can abut on the outer edges of the second through holes of the positioning member formed at equal positions at the borders between the probe main body portions and the probe tip portions, inserting the probe tip portions into the second through holes until the steps of the respective probes abut on the outer edges of the second through holes and relatively displacing the positioning members in the state enable three-dimensional positions of the probe tips of the probes to be positioned easily and accurately.

Since the plurality of probes have the steps that can abut on the outer edges of the first through holes of the probe substrate formed at equal positions at the borders between the probe main body portions and the attaching portions, inserting the respective probes into the corresponding first through holes until the steps of the respective probes abut on the outer edges of the first through holes of the probe substrate enables the length dimensions of the attaching portions to be inserted in the first through holes to be uniform.

In a case where the probe plate in which the plurality of probes are detachably coupled in a state of being arrayed in parallel by the tab integrally coupled with the plurality of probes is manufactured, and then each probe is separated from the tab, an inserting operation of the attaching portions in the first through holes becomes easy.

BRIEF DESCRIPTION OF DRAWINGS

FIG. 1 is a front view showing an embodiment of a probe card.

DETAILED DESCRIPTION

Figure 2A:
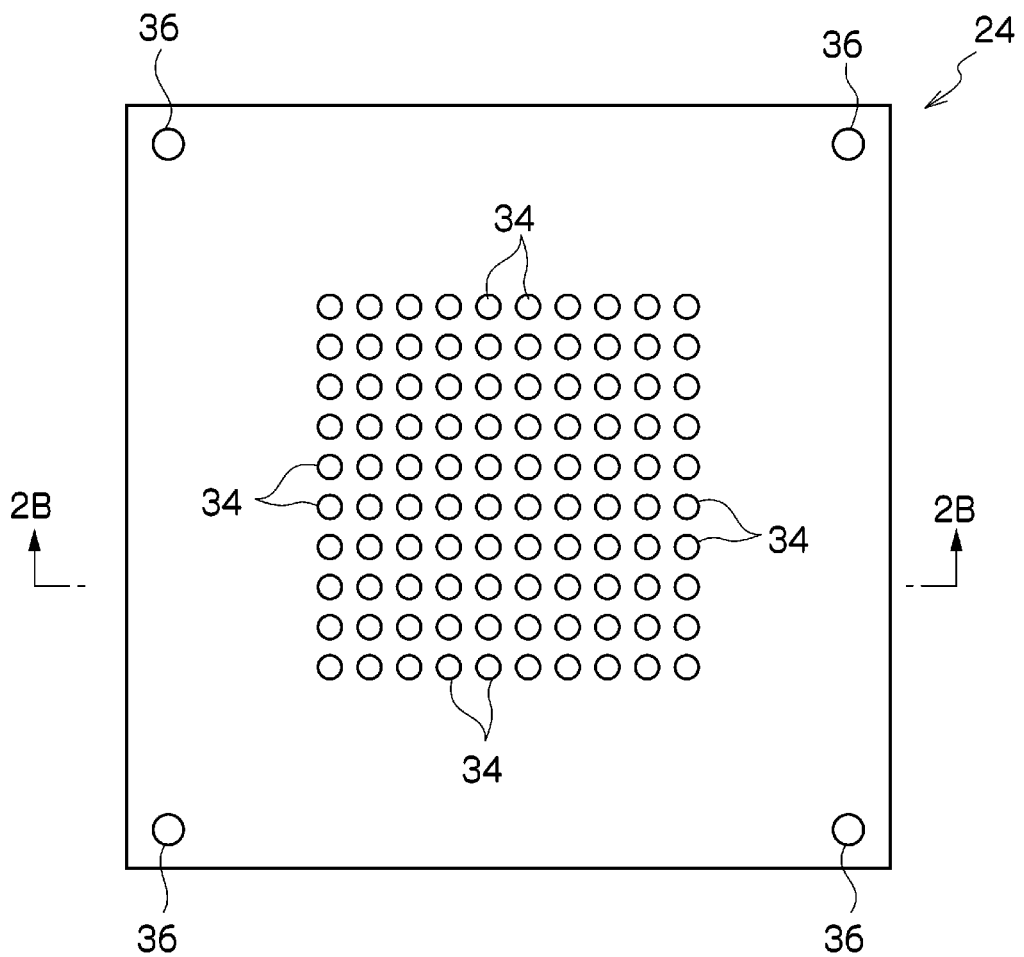
FIG. 2 (A) is a top view showing an embodiment of a probe substrate, and FIG. 2 (B) is a cross-sectional view obtained along the line 2B-2B in FIG. 2 (A).

In the embodiment of the subject matter, in FIG. 1, an up-down direction is referred to an up-down direction, a right-left direction is referred to as a right-left direction, and a direction perpendicular to the drawing sheet is referred to as a front-back direction. However, these directions differ with the posture of a device under test at the time of a test.

Accordingly, a probe card according to the embodiment of the subject matter may be used in any state such as a state in which a plane defined by the right-left direction and the front-back direction is a horizontal plane or a state in which it is inclined to a horizontal plane.

Embodiments

Referring to FIG. 1, a probe card 20 includes a wiring board 22, a probe substrate 24 arranged on the lower side of the wiring board 22, and multiple bar-like probes 26 arranged in the probe substrate 24 in a state of extending downward from the probe substrate 24.

The wiring board 22 is made of an electrical insulating material such as a glass-containing epoxy resin or a ceramic in a circular plate shape. The wiring board 22 has multiple conductive coupling portions 28 provided on the lower surface, multiple internal wires 30 each electrically connected to the coupling portion 28 at one end, and multiple connecting portions 32 provided on the upper surface.

The plural coupling portions 28 are arrayed on the wiring board 22 in plural rows, and each coupling portion 28 is in a land shape. The connecting portion 32 is a tester-land connected to an electric circuit of a tester in the example shown in the figure but may be a connector terminal.

Each internal wire 30 electrically connects the coupling portion 28 to the connecting portion 32. However, in a case where plural electronic components such as a capacitor, an IC relay, and an integrated circuit for a test are provided on the upper surface of the wiring board 22, some internal wires 30 connect the coupling portions 28 to the connecting portions 32, some internal wires 30 connect the coupling portions 28 to the electronic components, and the other internal wires 30 connect the connecting portions 32 to the electronic components.

Figure 2B:
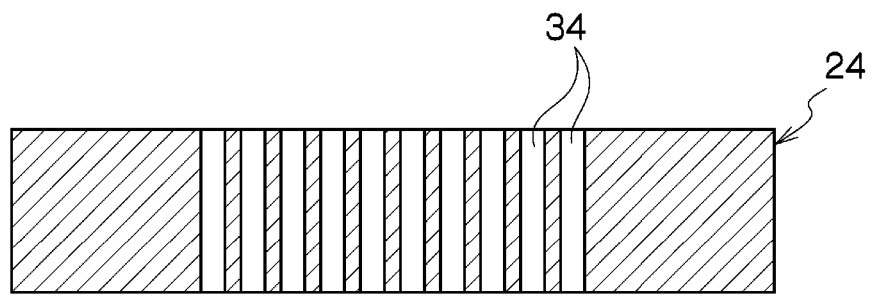

The probe substrate 24 is made of an electrical insulating material such as a ceramic in a rectangular plat plate shape, has at the central area multiple through holes 34 opened to the upper surface and lower surface and at the four corners through holes 36 respectively, as specifically shown in FIGS. 2 (A) and 2 (B). The multiple through holes 34 are arrayed on the probe substrate 24 in plural rows, and each through hole 34 receives an upper end portion of a corresponding probe 26. Each through hole 34 has a circular transverse cross-sectional shape.

Positioning pins (not shown) positioning the probe substrate 24 against the wiring board 22 can be inserted in a pair of through holes 36 located in one diagonal direction of a rectangular of the probe substrate 24. Bolts (not shown) attaching the probe substrate 24 to the wiring board 22 can be inserted in a pair of through holes 36 located in the other diagonal direction of the rectangular of the probe substrate 24. However, the positioning pins may be inserted in all of the through holes 36, and through holes in which the bolts are to be inserted may be provided at other locations.

Each probe 26 has a rectangular cross-sectional shape such as a prismatic column in the example shown in the figure. Each probe 26 has a probe main body portion 38 extending in the up-down direction, a probe tip portion 40 extending downward from the lower end of the probe main body portion 38, and an attaching portion 42 extending upward from the upper end of the probe main body portion 38. Each probe 26 has at the lower end a probe tip 44 to be thrust on an electrode of a device under test.

Each probe 26 is inserted in the through hole 34 of the probe substrate 24 at the attaching portion 42 in a state where the probe main body portion 38 and the probe tip portion 40 extend in the up-down direction from the probe substrate 24 and in a state where the upper portion of the attaching portion 42 is slightly projected upward from the probe substrate 24, is fixed at the wall portion forming the through hole 34 by a conductive jointing material or a hot-melt material (not shown), and is jointed at the upper end portion to the coupling portion 28 of the wiring board 22 by a conductive jointing material (not shown).

The probe main body portion 38 of each probe 26 is curved in the same direction. Each probe 26 is manufactured by a photolithographic technique in which exposure and etching are performed with use of a photoresist and a deposition technique such as electroforming and sputtering in which a metal material such as a nickel alloy represented by a nickel-boron alloy or a nickel-phosphorus alloy or nickel is deposited in a recess formed by the photolithographic technique.

The shape and structure of the probe 26 and the relationship between the wiring board 22 or the probe substrate 24 and the probes 26 will be described later in details.

Figure 3:
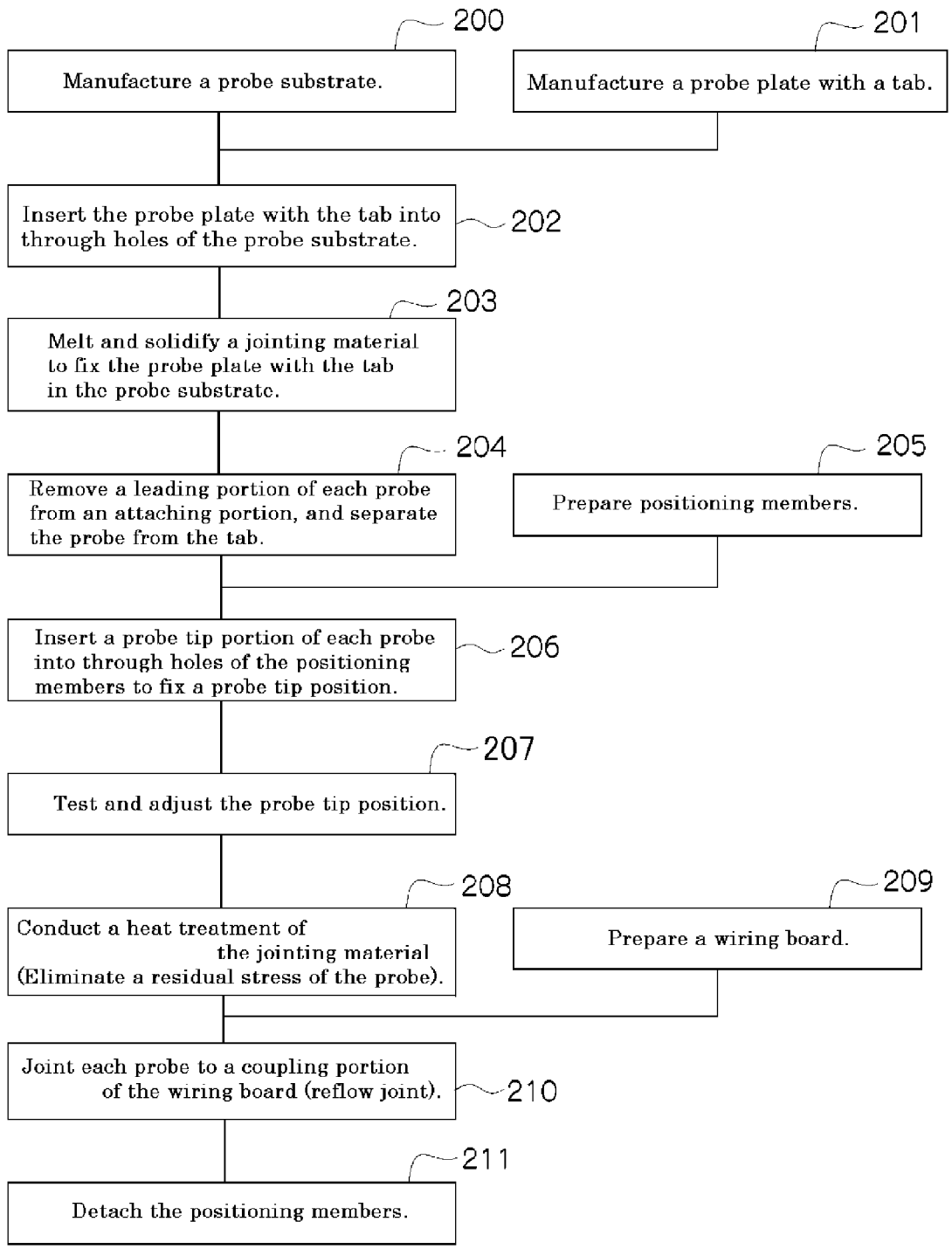
FIG. 3 is a flowchart illustrating a manufacturing method according to the embodiment of the subject matter.

Referring to FIG. 3, a method for manufacturing the above probe card will be described below.

Figure 4:
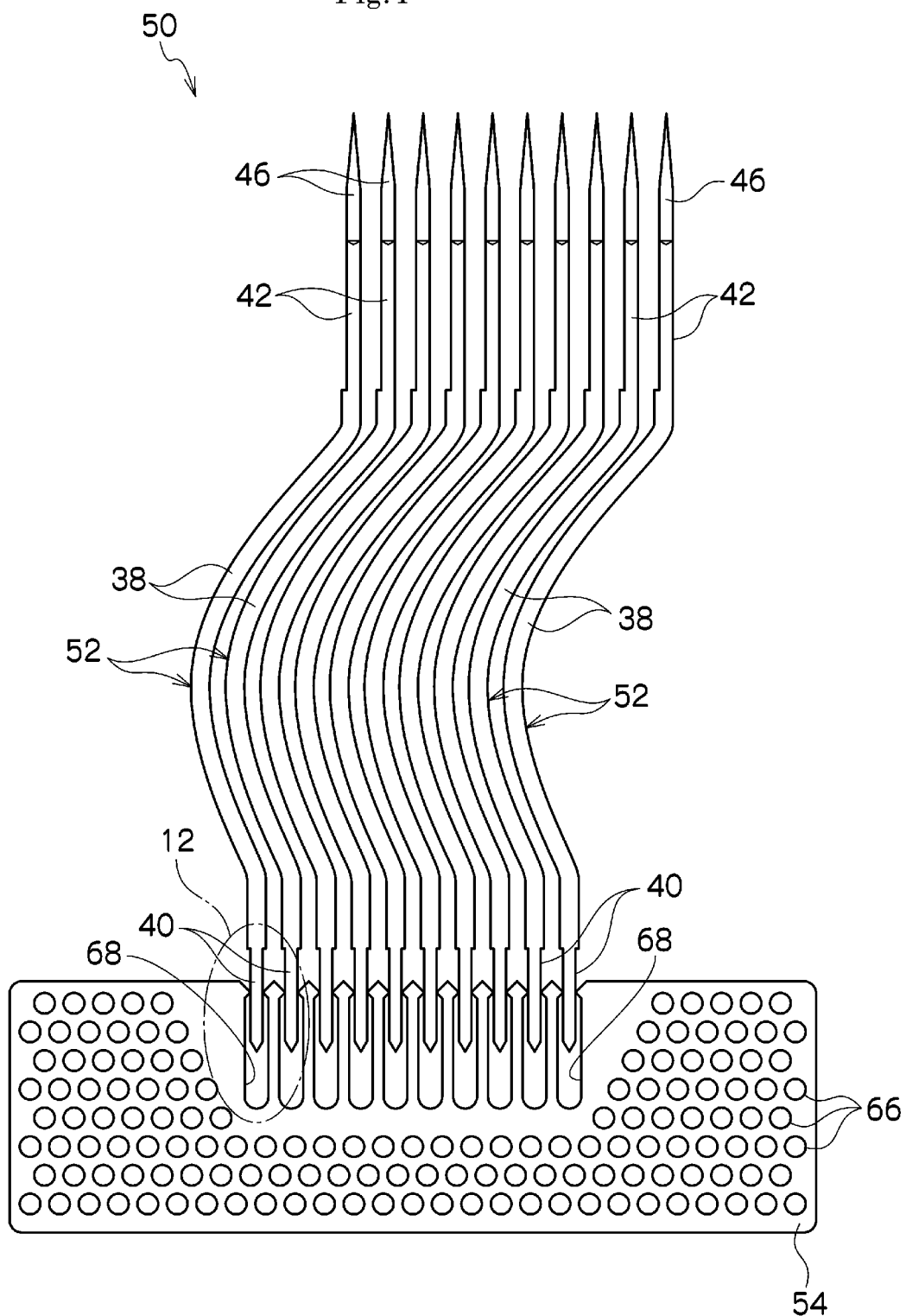
FIG. 4 is a front view showing an embodiment of a probe plate used in the embodiment of the subject matter.

First, the probe substrate 24 shown in FIG. 2 and plural probe plates 50 with tabs shown in FIG. 4 are manufactured (steps 200 and 201). The probe substrate 24 can be obtained by forming the through holes 34 and 36 on a ceramic plate by a laser process or a drilling process.

Figure 10A:
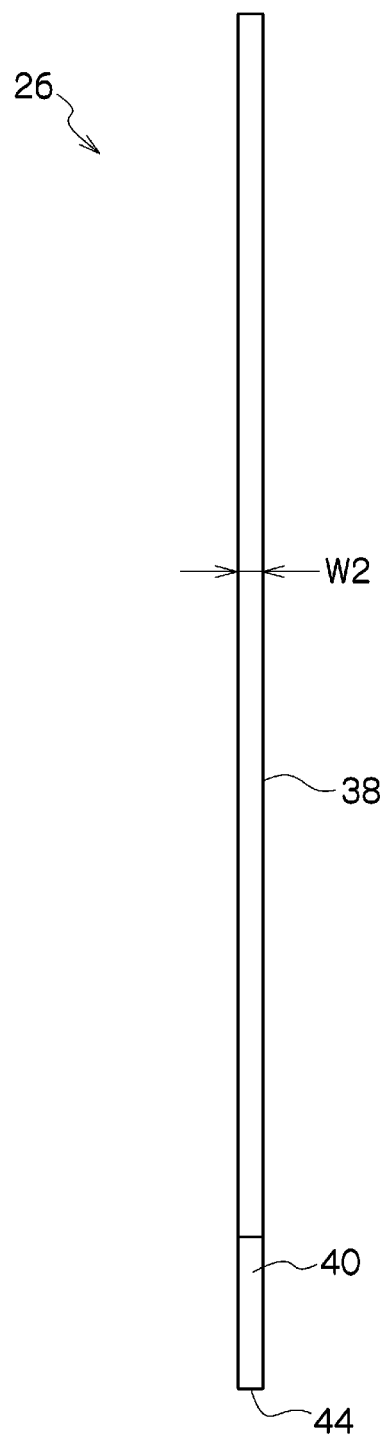
FIG. 10 (A) is a left side view showing an embodiment of the probe used in the embodiment of the subject matter, and FIG. 10 (B) is a front view of the probe shown in FIG. 10 (A).
Figure 10B:
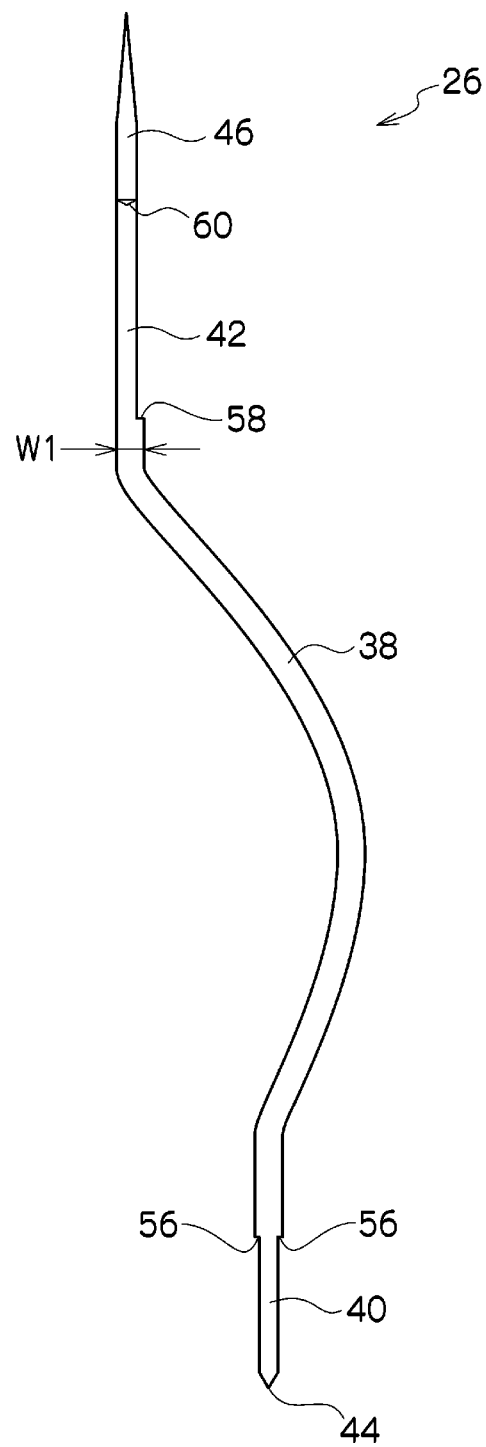
Figure 11:
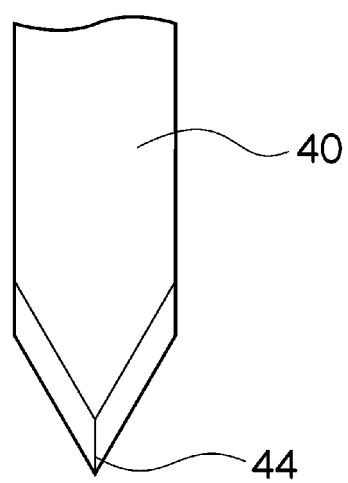
FIG. 11 is an enlarged perspective view showing the probe tip and its proximity.
Figure 12:
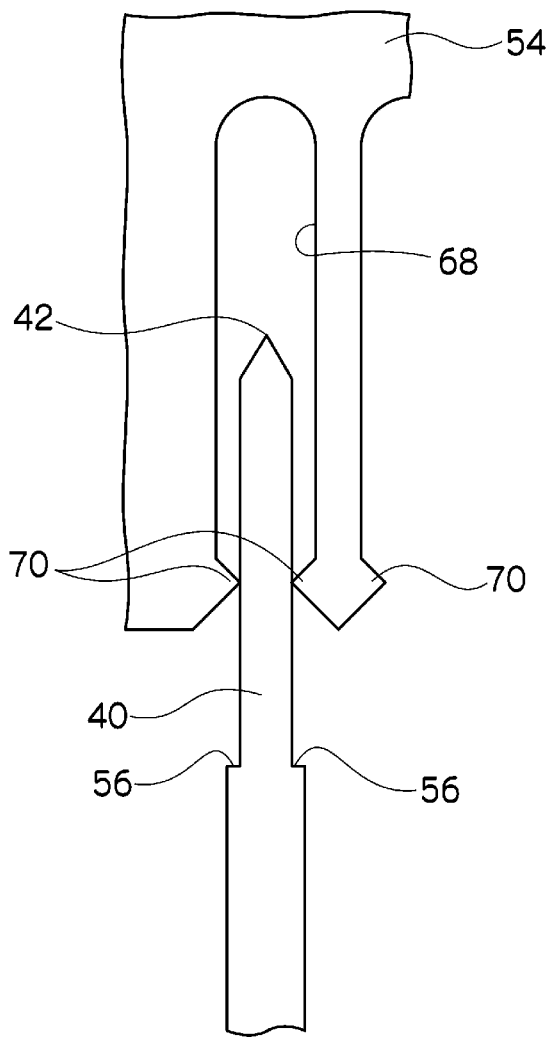
FIG. 12 is an enlarged view of the area 12 in FIG. 4.
Figure 13:
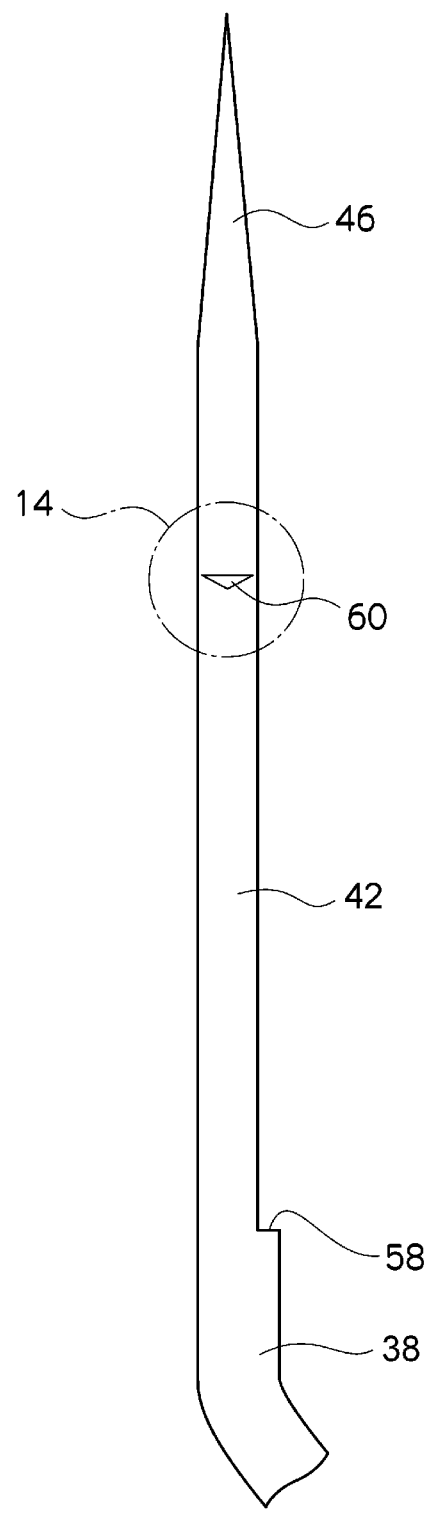
FIG. 13 is an enlarged view showing the attaching portion and the leading portion of the probe.

As shown in FIG. 4, each probe plate 50 includes plural probes 52 and a tap 54 putting the plural probes 52 together. The tab 54 is detachably coupled integrally with each probe 52 at the proximity of the probe tip 44 of each probe 52. As shown in FIGS. 10 to 12, each probe 52 has the probe main body portion 38 having a curved curve, the probe tip portion 40 continuing into the lower end of the probe main body portion 38 and having the probe tip 44 at the lower end, and the attaching portion 42 continuing into the upper end of the probe main body portion 38 in addition to a leading portion 46 continuing into the upper end of the attaching portion 42 and extending upward from the attaching portion 42.

The probe main body portion 38, the probe tip portion 40, the attaching portion 42, and the leading portion 46 are integrally made of a highly-resilient metal material such as a nickel alloy represented by a nickel-boron alloy or a nickel-phosphorus alloy or nickel. At least at the probe tip 44 is formed a highly hard metal film made of a metal material having higher hardness than those of materials for other portions such as the probe main body portion 38. Such a highly hard metal film can be formed by plating.

As specifically shown in FIGS. 10 to 15, the probe main body portion 38 has a rectangular cross-sectional shape. In the example shown in the figures, although a part of the probe main body portion 38 is curved in an arc to regard the curved portion as a curve, a part of the probe main body portion 38 may be bent in a lateral V shape to regard the bent portion as a curve. The probe main body portion 38 has a rectangular cross-sectional shape. Such a rectangle is shaped so that dimension (thickness dimension or width dimension) W1 in the right-left direction of the probe main body portion 38 may be equal or slightly larger than dimension W2 in the front-back direction, as shown in FIG. 10.

The probe tip portion 40 has an upper area having a rectangular cross-sectional shape in which a dimension corresponding to dimension W1 is smaller than a dimension corresponding to dimension W2 and a lower area in which a dimension corresponding to dimension W1 is decreased toward the side of the probe tip 44. Accordingly, downward steps 56 at a border between the probe main body portion 38 and the probe tip portion 40 are formed on one side and the other side in the right-left direction, respectively.

The attaching portion 42 has a rectangular cross-sectional shape in which a dimension corresponding to dimension W1 is smaller than a dimension corresponding to dimension W2. The attaching portion 42 is eccentrically located on one side in the right-left direction of the upper end portion of the probe main body portion 38. Accordingly, an upward step 58 at a border between the probe main body portion 38 and the attaching portion 42 is formed on one side in the right-left direction.

The leading portion 46 extends upward on the same axis as that of the attaching portion 42 and has a lower area having a rectangular cross-sectional shape that has the same size and the same shape as those of the attaching portion 42 and an upper area in which a dimension corresponding to dimension W1 is decreased toward the upper end side.

Each probe 26 also has on the upper end surface of the attaching portion 42 a recess or an opening 60 ranging from one side to the other side of two surface areas forming two opposed sides of a rectangle. A metal layer 62 is formed on an outer circumferential surface of an upper area of the attaching portion 42, on two opposed surface areas of an area continuing into the upper area, and on a surface area forming the opening 60. Further, a jointing material layer 64 is provided to cover exposed portions of three outer circumferential surfaces at the upper area of the attaching portion 42 and the metal layer 62 at the two opposed surface areas of the area continuing into the upper area.

Figure 14:
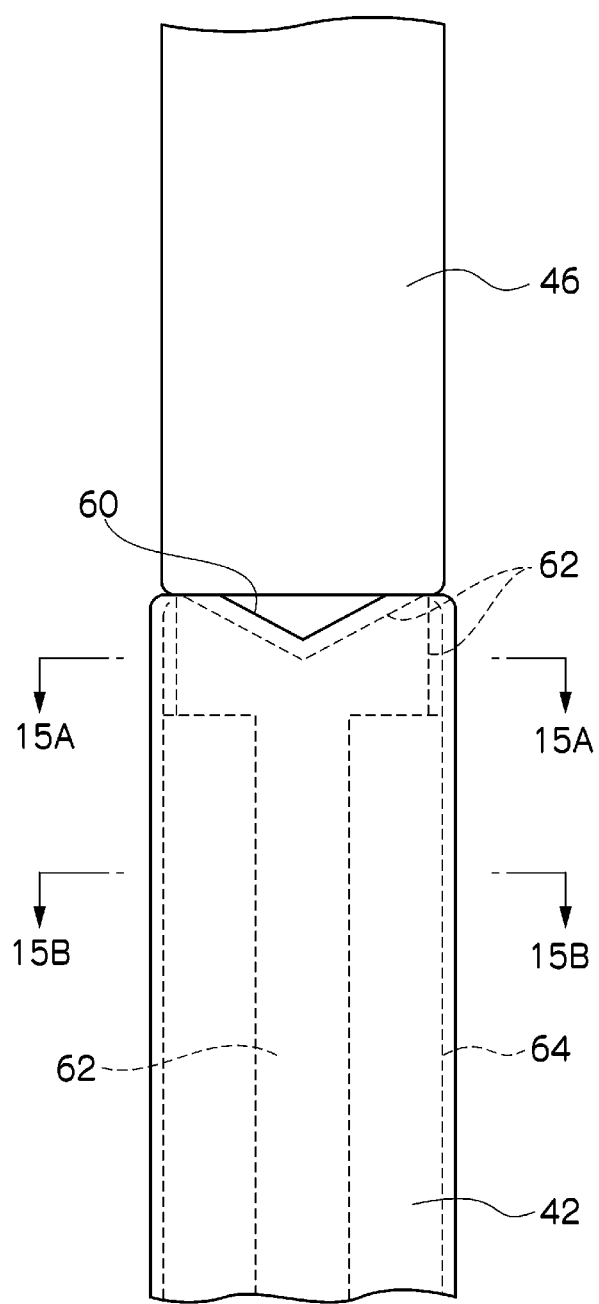
FIG. 14 is an enlarged view of the area 14 in FIG. 13.
Figure 15A:
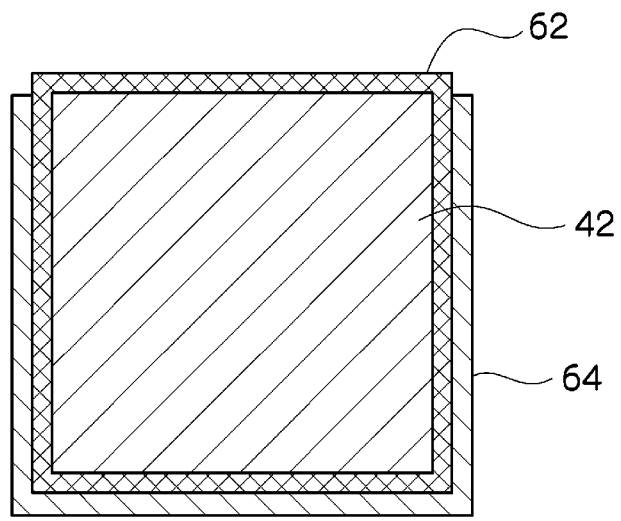
FIG. 15 (A) is an enlarged view obtained along the line 15A-15A in FIG. 14, and FIG. 15 (B) is an enlarged view obtained along the line 15B-15B in FIG. 14.
Figure 15B:
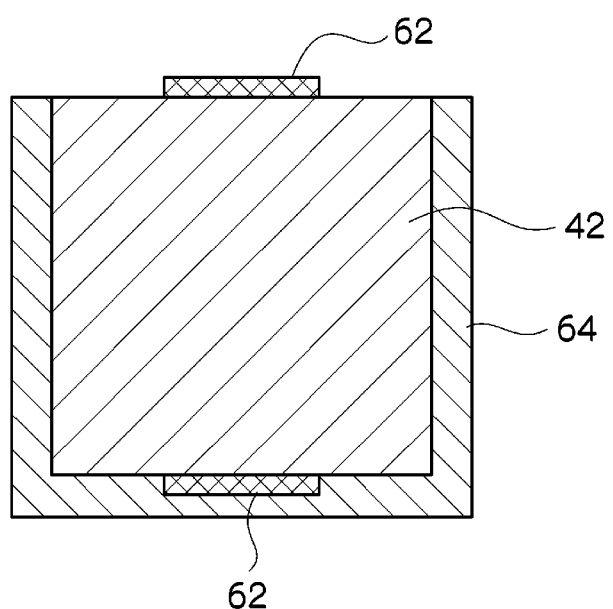

In the example shown in FIGS. 14 and 15, the metal layer 62 provided on the outer circumferential surface of the upper area of the attaching portion 42 is provided over the entirety in the circumferential direction of the upper area, and the metal layer 62 provided at the two surface areas is in a strip shape having a smaller width dimension than that of the surface area and extending along the entire area in the longitudinal direction of the attaching portion 42.

The metal layer 62 is made of a material in which wettability of the jointing material layer 64 to the metal layer 62 is higher than wettability of the jointing material layer 64 to the attaching portion 42. Also, the jointing material layer 64 is made of a metal material having a lower melting point than those of the attaching portion 42 and the metal layer 62. In a case where the attaching portion 42 is made of a nickel metal material such as nickel or a nickel alloy, a material for the metal layer 62 can be a gold or silver metal material such as gold, a gold alloy, silver, or a silver alloy, and a material for the jointing material layer 64 can be a tin metal material such as tin or a tin-lead alloy.

As shown in FIG. 4, the tab 54 is in a rectangular plate shape having the same thickness dimension as a thickness dimension of the probe 26 in the front-back direction and is made of the same metal material as those for the probe main body portion 38, the probe tip portion 40, and the leading portion 46 of the probe 26 to be integral with the probe 26. The tab 54 has multiple holes 66 penetrating in the thickness direction and has on one side of the rectangle multiple recesses 68 spaced in a direction of one side of the rectangle, as shown in FIG. 4. In each recess 68 is located the probe tip portion 40 of the probe 26.

As shown in FIG. 12, each recess 68 is formed in an Ω shape, and an entrance of each recess 68 is narrowed by two opposed projecting portions or coupling portions 70. Each coupling portion 70 is in a triangular shape and makes a tip end corresponding to the apex of the triangle opposed. The probe tip portion 40 is integrally coupled with the tip ends of the coupling portions 70.

The above probe plate 50 can be manufactured by the aforementioned photolithographic technique and deposition technique.

Figure 16:
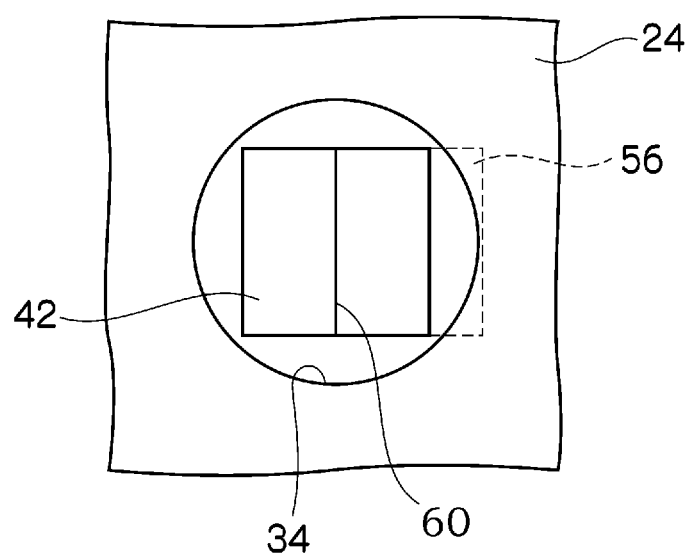
FIG. 16 is an enlarged view seen from a direction of the arrow 16 in FIG. 5.
Figure 17A:
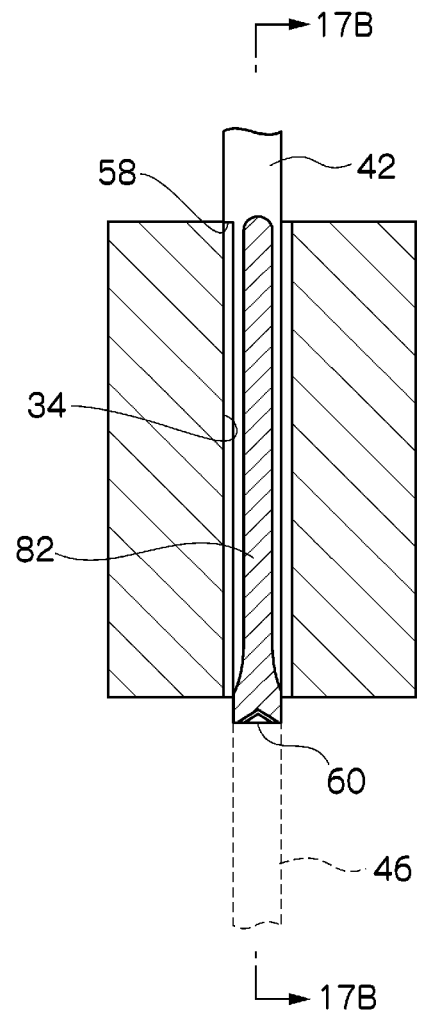
FIG. 17 (A) is a cross-sectional view showing an embodiment of a coupling state of the probe with the probe substrate, FIG. 17 (B) is a cross-sectional view obtained along the line 17B-17B in FIG. 17 (A), and FIG. 17 (C) is a view seen from the lower side of FIG. 17 (A) with parts of a jointing material hatched.
Figure 17B:
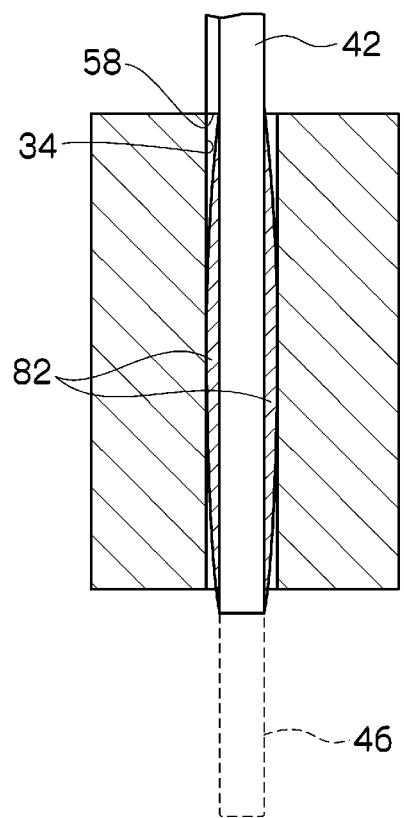
Figure 17C:
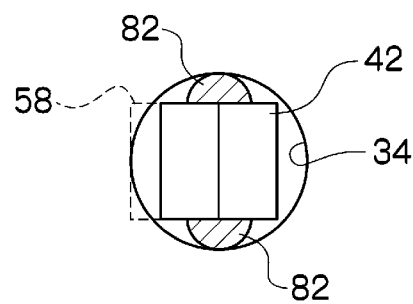

Returning to FIG. 3, the attaching portion 42 of the probe 52 of the above probe plate 50 is then inserted into the through hole 34 of the probe substrate 24 from the side of the leading portion 46 (step 202). The length dimension of the attaching portion 42 is slightly longer than the thickness dimension of the probe substrate 24. Accordingly, as shown in FIGS. 5, 16, and 17, when the attaching portion 42 is inserted until the step 58 abuts on the probe substrate 24, the attaching portion 42 makes the end portion on the side of the leading portion 46 slightly project from the probe substrate.

Abutment of the step 58 on the probe substrate 24 enables the attaching portion 42 of each probe 52 to be inserted into the through hole 34 easily so that the inserting lengths of the probes 52 in the through holes 34 may be equal to one another, and so that the projecting length of the attaching portion 42 from the probe substrate 24 may be equal to one another.

Figure 5:
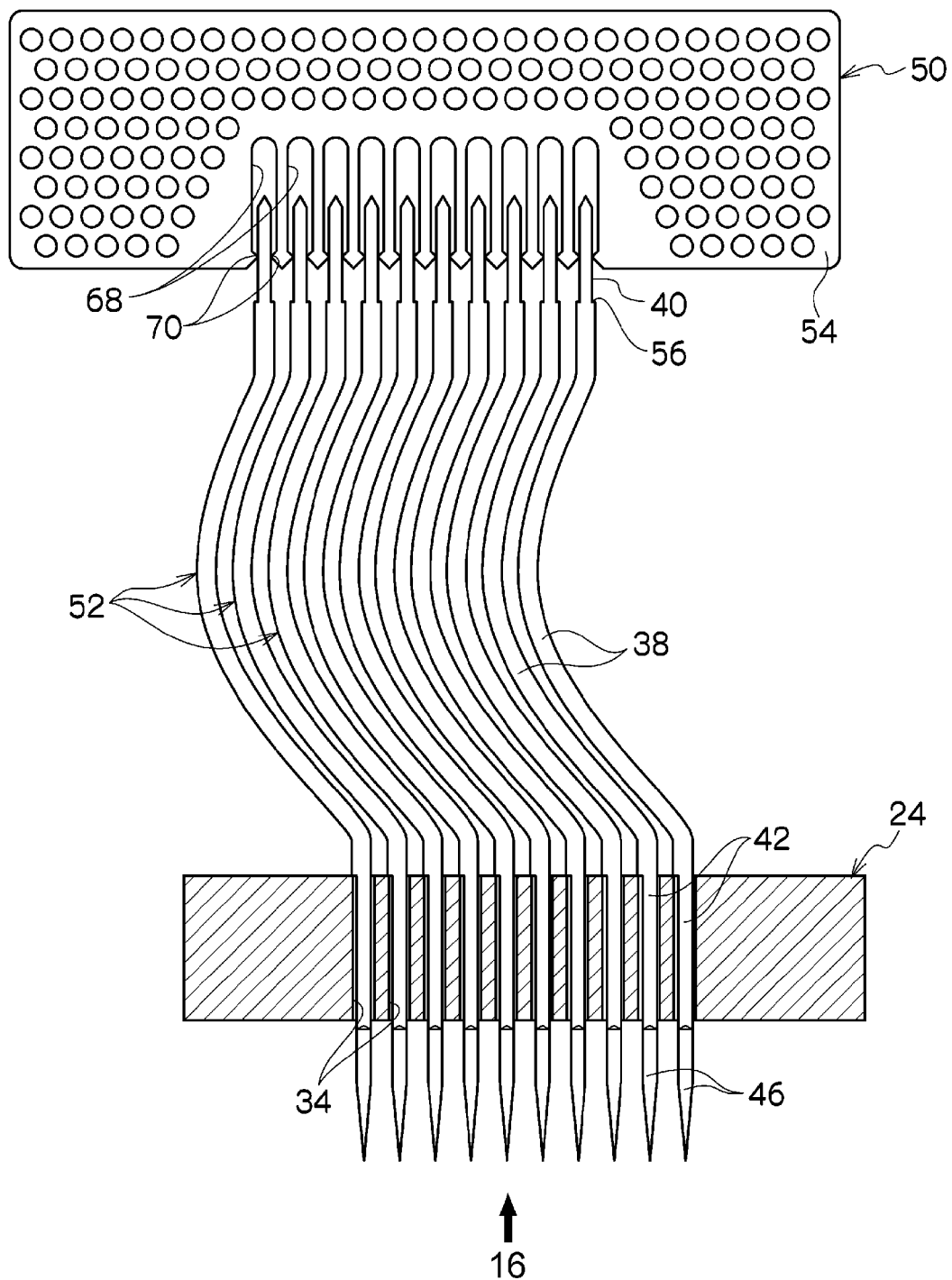
FIG. 5 shows a state in which attaching portions of probes coupled with the probe plate are inserted in through holes of the probe substrate.

Inserting the attaching portion 42 into the through hole 34 in a state where each probe 52 is upside down as shown in FIG. 5 facilitates the inserting operation of the attaching portion 42 into the through hole 34. Also, the fact that the dimension corresponding to dimension W1 at the lower area of the leading portion 46 is decreased toward on the upper end side facilitates the inserting operation of the attaching portion 42 into the through hole 34.

Subsequently, the probe substrate 24 and the probe plate 50 are heated, the material (jointing material) for the jointing material layer 64 is melted, and thereafter the molten material is solidified (step 203). Consequently, each probe 52 is fixed in the through hole 34 of the probe substrate 24.

As described above, the metal layer 62 is made of the material in which wettability of the liquefied material of the jointing material layer 64 to the metal layer 62 is higher than wettability of the jointing material layer 64 to the attaching portion 42. Accordingly, when the jointing material layer 64 covering the metal layer 62 as shown in FIG. 15 is melted at step 203, the molten material or the liquefied material is concentrated on the metal layer 62 by its own surface tension and is solidified in this state to become a jointing material 82 filling a gap between the outer circumferential surface of the attaching portion 42 and the inner surface forming the through hole 34 and jointing the probe 26 to the probe substrate 24, as shown in FIG. 17. As a result, each probe 52 is fixed to the probe substrate 24 at the attaching portion 42.

Figure 6:
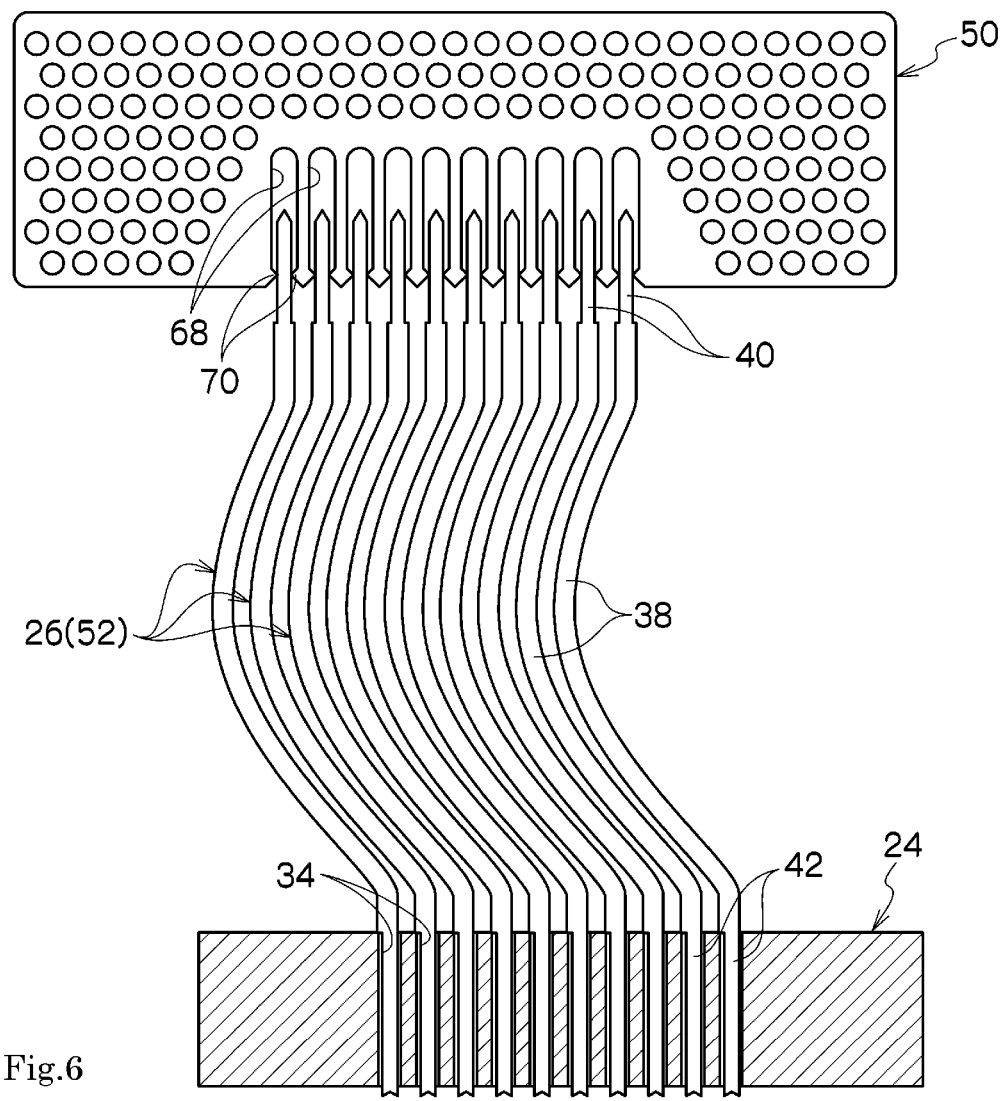
FIG. 6 shows a state in which a leading portion of each probe has been removed.

Subsequently, as shown in FIG. 6, the leading portion 46 is detached from each probe 52 with the tab, and each probe 52 is separated from the tab 54 at the probe tip portion 40 and the coupling portions 70 (step 204). By doing so, each probe 52 is converted into the probe 26 for the probe card 20, and a probe assembly is obtained.

Figure 7B:
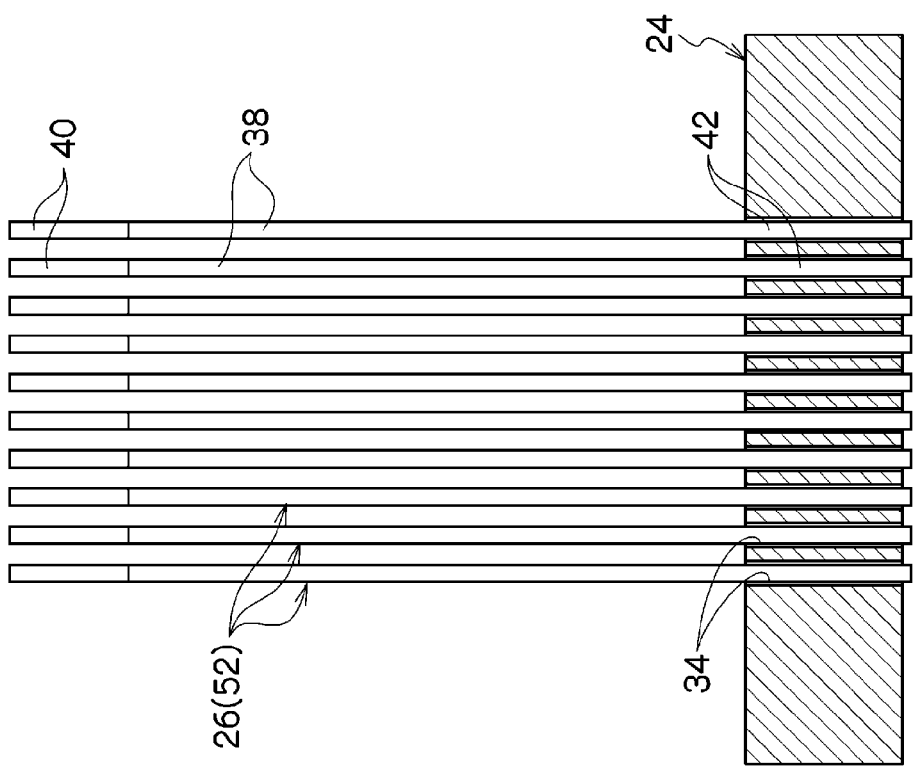
FIG. 7 (A) is a front view, and FIG. 7 (B) is a right side view, showing a state in which each probe has been separated from a tab.
Figure 7A:
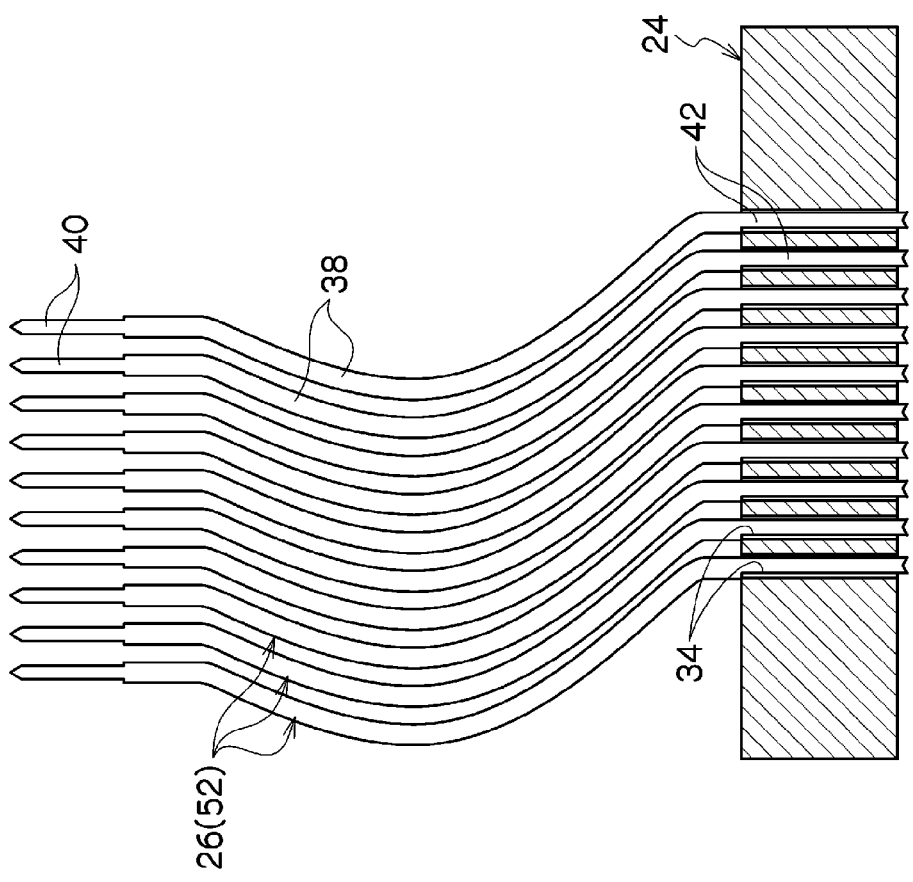
Figure 20:
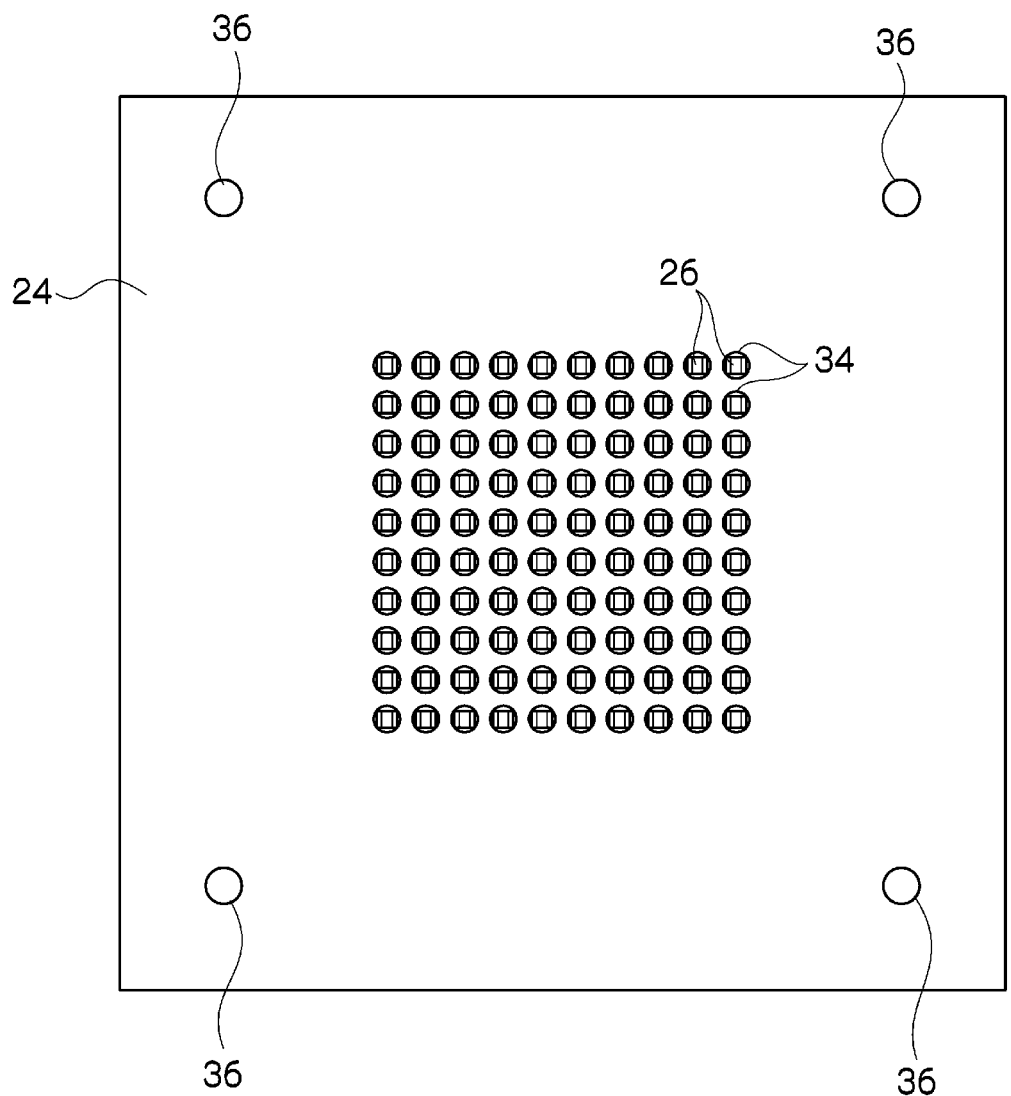
FIG. 20 is a plan view showing the probe substrate after the tab is removed.

The detaching operation of the leading portion 46 can be done easily by breaking the leading portion 46 from the attaching portion 42 since the dimension of the probe 52 is as small as several tens of to a hundred and several tens of microns. The obtained probe assembly is shown in FIG. 7, and the bottom view of FIG. 7 is shown in FIG. 20. By detachment of the leading portion 46, the opening 60 existing at the border between the attaching portion 42 and the leading portion 46 functions as a groove or a recess opened to a side opposite the probe main body portion 38 and having a V cross-sectional shape.

Figure 18:
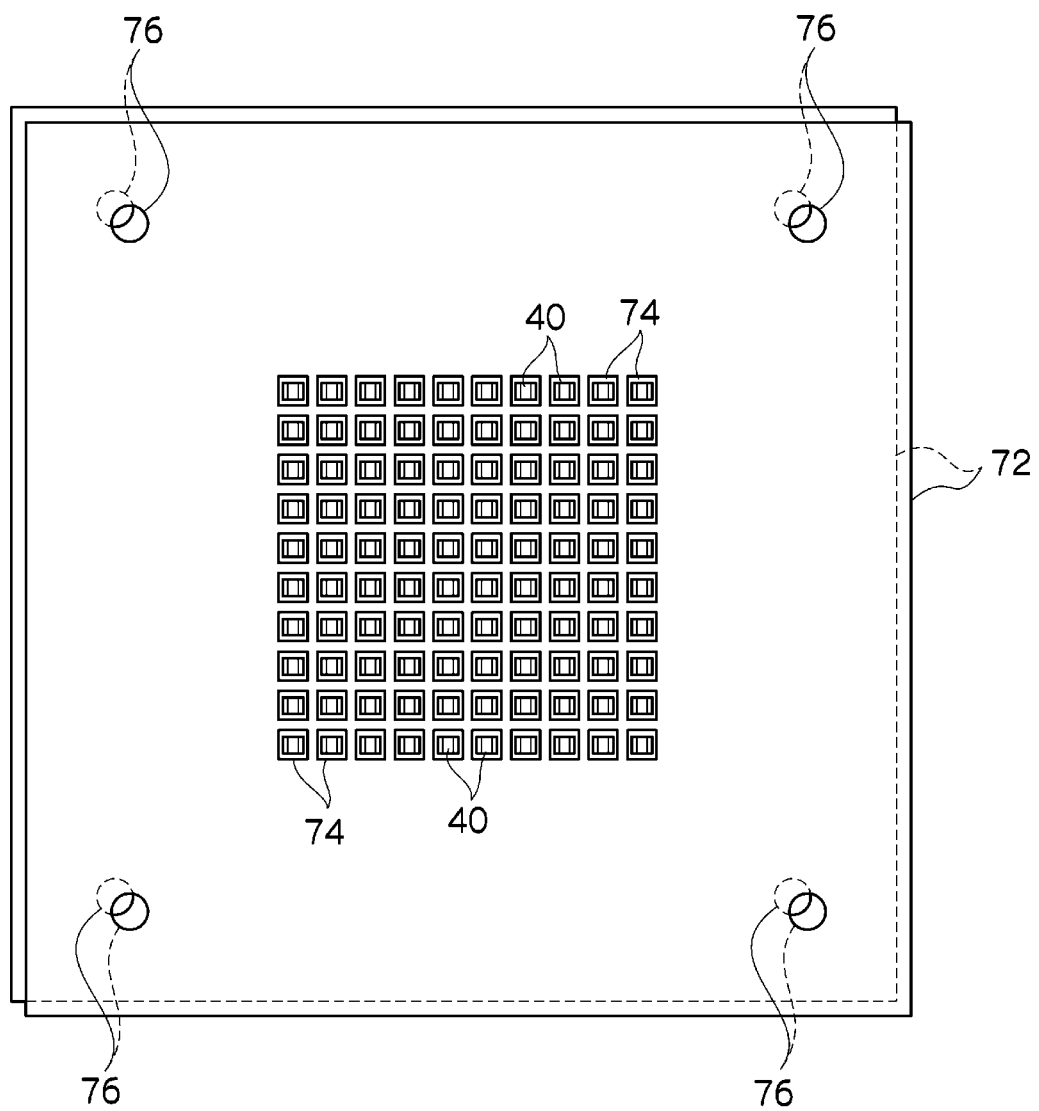
FIG. 18 is a plan view showing an embodiment of the positioning members.

Subsequently, three plate-like positioning members 72 manufactured in a separate process from the above are prepared (step 205). Each positioning member 72 is formed in a rectangular shape having the same size and has at the central area multiple rectangular through holes 74 penetrating in the thickness direction in plural rows and at the four corners through holes 76 respectively, as shown in FIG. 18.

Each positioning member 72 is made of a metal material or a resin material to prevent the through holes 76 from being deformed. The positioning member 72 can be manufactured by the photolithographic technique and the deposition technique.

Each of the through holes 74 of each positioning member 72 has a larger dimension than the rectangular cross-section of the probe tip portion 40, and the through holes 74 are provided in the positioning member 72 to have equal dimensions and equal distances to one another. Accordingly, the probe tip portions 40 are easily inserted into the three positioning members piled up in a state where the through holes 74 are aligned.

The through holes 76 of the respective positioning members 72 have equal dimensions to one another and are formed in the positioning members 72 so as to be aligned with one another in a case where the respective positioning members 72 are piled up in a state where each communicating part of the through holes 74 of the piled positioning members 72 is in an equal shape to the rectangular cross-section of the probe tip portion 40. Thus, in a state where the through holes 76 are aligned, the probe tip portion 40 inserted in each through hole 74 of the piled positioning members 72 is clamped by the three positioning members.

Figure 8:
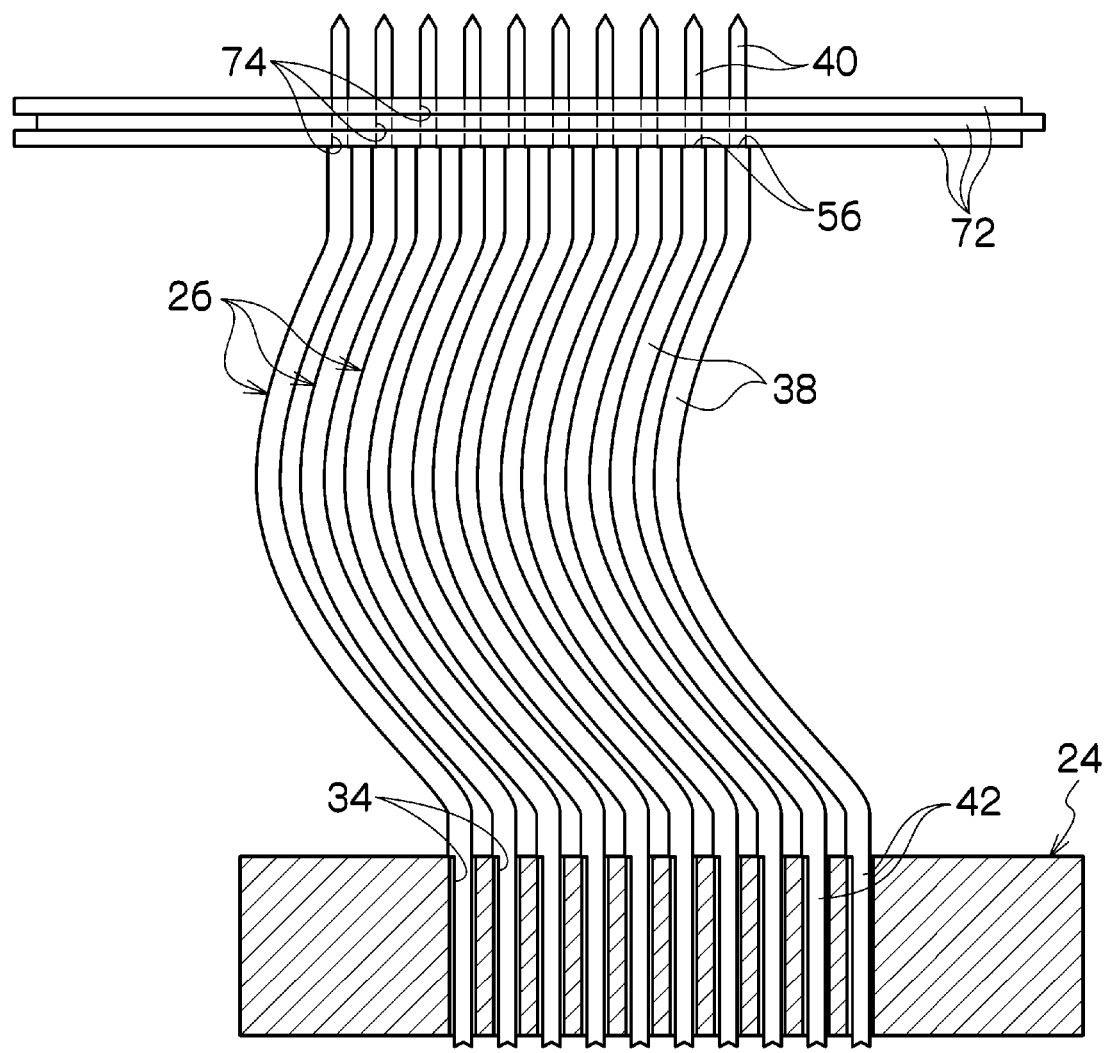
FIG. 8 shows a state in which two-dimensional relative positioning of probe tips is done by a plurality of positioning members.
Figure 9:
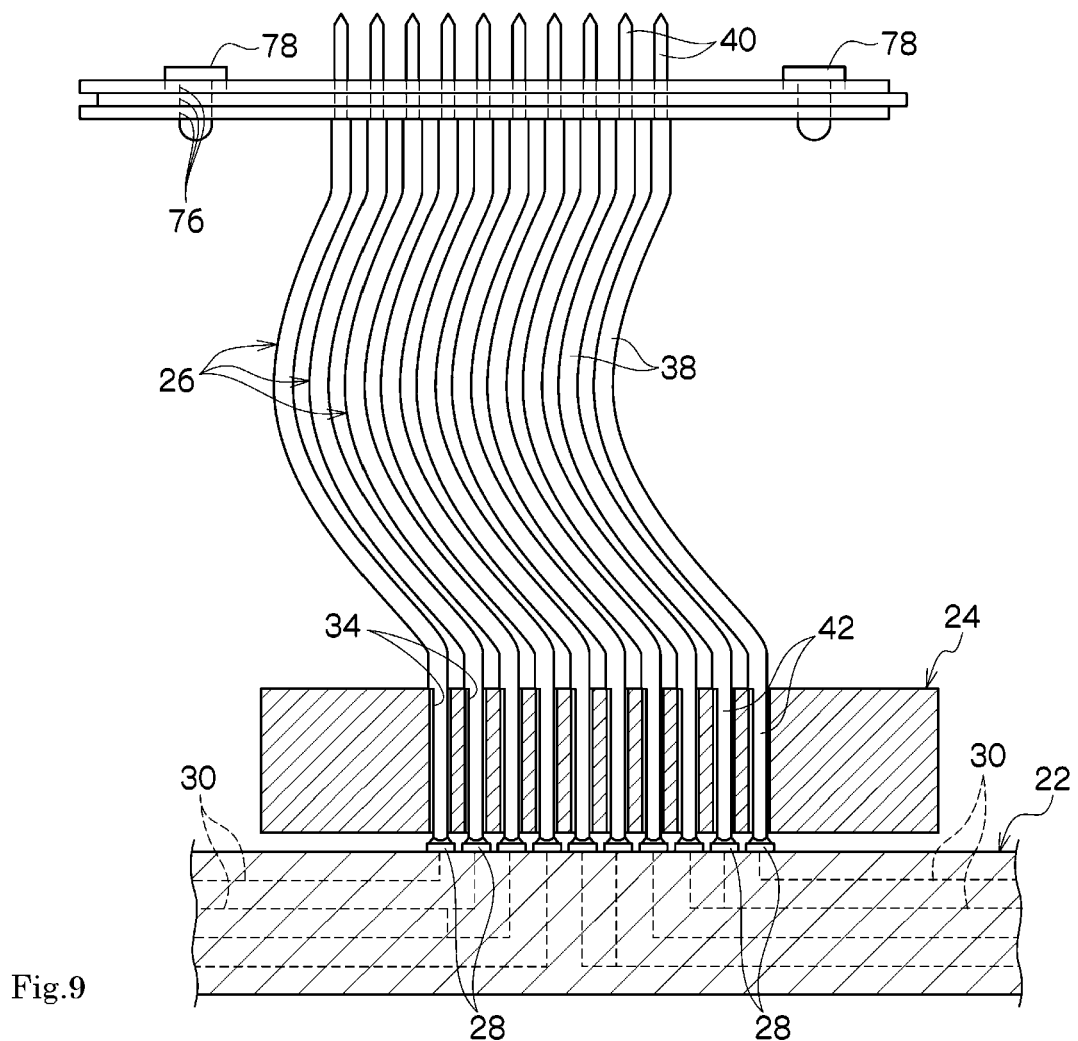
FIG. 9 shows a state in which a probe assembly is coupled with a wiring board.
Figure 19:
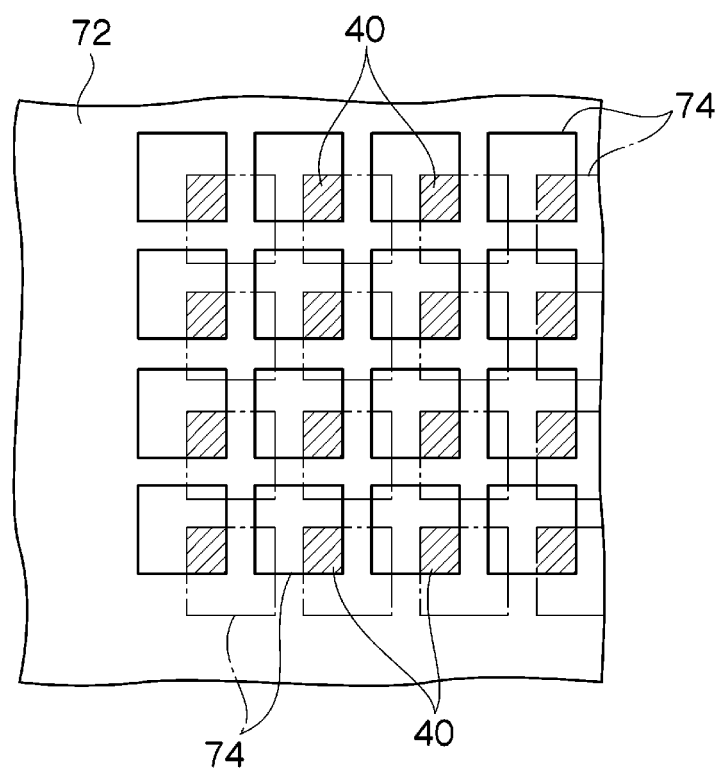
FIG. 19 illustrates mutual positioning of the probe tips.

Referring to FIG. 8, the probe tip portion 40 of each probe 26 is inserted in the respective through holes 74 of the three positioning members 72 piled in a state where the through holes 74 are aligned, and thereafter the positioning members 72 are moved in parallel to bring a state where the through holes 76 are aligned (refer to FIG. 19). Each check 78 is inserted in the aligned through holes 76 to temporarily joint the three positioning members 72 in the positional relationship (refer to FIG. 9). Accordingly, the probe tip portions 40 of the plural probes 26 are positioned to one another in the right-left direction and the front-back direction. Also, since the probe tip portion 40 of each probe 26 is inserted in the through hole 34 until the step 56 abuts on the positioning members 72, the probe tip portions 40 of the plural probes 26 are positioned to one another in the up-down direction.

At step 206, positioning is done with use of the positioning members 72 as above, as a result of which three-dimensional positioning of the probe tip portions 40 of the plural probes 26 can be done easily and accurately.

Subsequently, in a state where the relative position among the probe tip portions 40 is maintained by the three positioning members 72, two-dimensional positions of the probe tips 44 are tested and adjusted (step 207). Instead of using three positioning members 72, two or four or more positioning members 72 may be used.

Subsequently, a heat treatment of the jointing materials 82 of all probes 26 is conducted (step 208). In this heat treatment, the jointing materials 82 are heated approximately at a half temperature of a melting temperature of the jointing material 82 (for example, in a case of tin, 150° C. to 170° C.) for several hours (for example, 2 to 3 hours) and are thereafter cooled gradually.

Since the jointing material 82 of each probe 26 is softened to be deformable by the above heat treatment, the attaching portion 42 of each probe 26 can be displaced against the through hole 34 by deforming the softened jointing material 82. Consequently, due to the fact that the relative position among the probe tips 44 is maintained by the positioning members 72, a residual stress such as a strain existing in each probe 26 is eliminated, each probe 26 is held in the probe substrate 24 in a stable manner, and the relative positional relationship among the probe tips 44 of the probes 26 becomes stable.

At step 208, at least part of the jointing material 82 fixing the attaching portion 42 to the through hole 34 is also softened, but due to the wettability of the jointing material to the metal layer 62 and the surface tension of the jointing material, the molten or softened jointing material 82 returns to a state of filling a gap between the outer circumferential surface of the attaching portion 42 and the inner surface forming the through hole 34 after it is solidified.

Subsequently, the wiring board 22 manufactured in a separate process from the above and described above is prepared (step 209).

Subsequently, each probe 26 is fixed to the coupling portion 28 of the wiring board 22 at its end on the side of the attaching portion 42 (step 210). This operation is done by arranging the probe substrate 24 to one surface side of the wiring board 22 in a state where the end surface of each probe 26 on the side of the attaching portion 42 abuts on the coupling portion 28 of the wiring board 22 and melting in this state and thereafter solidifying the jointing material 82 existing at least at the end of the attaching portion 42.

At step 210, at least part of the jointing material 82 fixing the attaching portion 42 to the through hole 34 is also melted or softened, but due to the wettability of the jointing material to the metal layer 62 and the surface tension of the jointing material, the molten or softened jointing material 82 returns to a state of filling a gap between the outer circumferential surface of the attaching portion 42 and the inner surface forming the through hole 34 after it is solidified.

Thereafter, the positioning members 72 are detached from the probes 26 (step 211). This operation can be done by removing the checks 78 and then pulling out the respective positioning members 72 from the probe tip portions 40. However, without detaching the positioning members 72, that is, in a state of maintaining the two-dimensional positions of the probe tips 44 by the positioning members 72, the probe card may be used. In this case, the positioning members 72 are made of electrical insulating materials.

As a result of the above, the probe card 20 shown in FIG. 1 is completed. In the completed probe card 20, since the jointing material (not shown) jointing the attaching portion 42 to the coupling portion 28 exist in the opening or the recess 60 (refer to FIG. 14), the contact area of the jointing material to the attaching portion 42 is large, and the jointing strength between the attaching portion 42 and the coupling portion 28 is high.

The above steps can be changed arbitrarily.

For example, in the operations at step 203, the operation of melting and thereafter solidifying the material for the jointing material layer 64 to fix the attaching portion 42 in the through hole 34 may be done before or at step 211. Also, in the operations at 211, the operation of pulling out each positioning member 72 from the probe tip portions 40 may be done between step 208 and step 210. Also, in the operations at step 204, the operation of detaching the leading portion 46 from the attaching portion 42 may be done before step 203.

Figure 21:
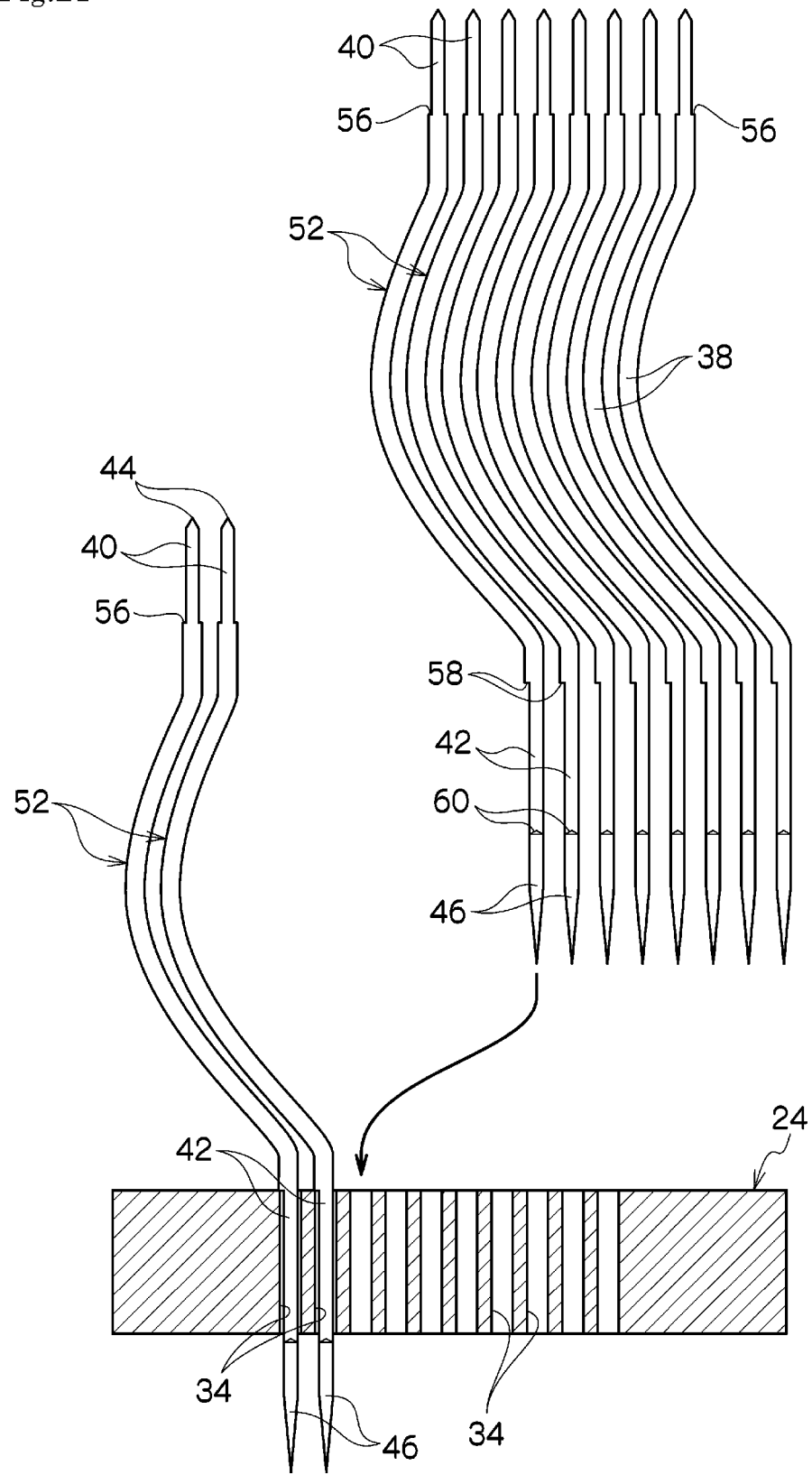
FIG. 21 illustrates another embodiment of the embodiment of the subject matter.

Instead of the plural probes 52 coupled with the plate-like tab 54, multiple respectively independent probes 52 may be used as shown in FIG. 21.

INDUSTRIAL APPLICABILITY

The embodiment of the subject matter is not limited to the above embodiments but may be altered in various ways without departing from the spirit and scope of the embodiment of the subject matter.

REFERENCE SIGNS LIST 20 probe card
22 wiring board
24 probe substrate
26 probe
28 coupling portion
30 internal wire
32 connecting portion
34, 36 through hole
38 probe main body portion
40 probe tip portion
42 attaching portion
44 probe tip
46 leading portion
50 probe plate
52 probe
54 tab
56, 58 step
60 opening (recess)
62 metal layer
64 jointing material layer
66 hole
68 recess
70 coupling portion
72 positioning member
74, 76 through hole
78 check
82 jointing material

What is claimed is:

1. A method for manufacturing a probe card, comprising:
   manufacturing a plurality of probes, wherein each probe has a probe main body portion extending in a longitudinal direction, a probe tip portion extending from a lower end of the probe main body portion, an attaching portion extending from an upper end of the probe main body portion, and a layer of a conductive jointing material provided on an outer surface of an upper portion of the attaching portion;
   preparing a probe substrate having a plurality of probe through holes formed therein and arrayed on the probe substrate at least in a row;
   after the preparing, inserting the attaching portion of each of the plurality of probes into a respective one of the plurality of probe through holes;
   after inserting the attaching portions into the probe through holes, inserting the probe tip portion of each of the plurality of probes into respective positioning through holes of the at least two positioning members piled in their thickness directions at least in a row and in a state where the positioning through holes are aligned;
   after inserting the probe tip portions into the positioning through holes, relatively displacing the at least two positioning members to two-dimensionally position the probe tip portions of the probes against the probe substrate; and
   softening the conductive jointing material to eliminate a stress generated in the probes by positioning of the probe tip portions of the probes against the probe substrate.

2. The method for manufacturing a probe card according to claim 1, further comprising, after preparing the probe substrate, melting the jointing material and thereafter solidifying the molten jointing material to fix the attaching portion of each of the plurality of probes in its respective probe through hole of the probe substrate.

3. The method for manufacturing a probe card according to claim 1, wherein the probe tip portion of each probe and each positioning through hole of each positioning member have rectangular cross-sectional shapes, and
   wherein the method further includes piling the at least two positioning members so that the corresponding positioning through holes of adjacent positioning members are aligned to one another and relatively displacing the adjacent positioning members in a diagonal direction of the rectangular cross-sectional shape of the positioning through holes to maintain the adjacent positioning members in a state where the probe tip portions are clamped by edge portions of the positioning through holes.

4. The method for manufacturing a probe card according to claim 1, wherein each of the plurality of probes has, at a border between the probe main body portion and the probe tip portion, a step abutting on an outer edge of its respective positioning through hole of the at least two positioning members when the probe tip portion is inserted into the corresponding positioning through hole.

5. The method for manufacturing a probe card according to claim 1, further comprising manufacturing a probe plate, the probe plate having the plurality of probes and a tab integrally coupling the probes and detachable from each probe at the proximity of the probe tip portion of each probe, and
   wherein the method further comprises separating the tab from each probe before the probe tip portion is inserted in the respective positioning through holes.

6. The method for manufacturing a probe card according to claim 1, wherein each of the plurality of probes has a leading portion extending from the upper portion of the attaching portion, and
   wherein inserting the attaching portion into the respective one of the plurality of probe through holes includes inserting the attaching portion of each of the plurality of probes into the respective one of the plurality of probe through holes from a side of the leading portion,
   the method further comprising, after preparing the probe substrate, removing the leading portion of each of the plurality of probes from the attaching portion, and after softening the conductive jointing material, removing the positioning members from the probes.

7. The method for manufacturing a probe card according to claim 1, wherein the plurality of probe through holes are arrayed in plural rows,
   wherein manufacturing the plurality of probes includes manufacturing a plurality of probe plates, each probe plate having the plurality of probes and a tab integrally coupling the plurality of probes and detachable from each of the plurality of probes at the proximity of the probe tip portion of each of the plurality of probes, and
   wherein the method further comprises separating the tab from each of the plurality of probes before the probe tip portion is inserted in the positioning through holes.

8. The method for manufacturing a probe card according to claim 1, further comprising arranging the probe substrate on one surface of a wiring board and jointing the upper portions of the attaching portions projecting from the probe through holes to a plurality of coupling portions formed on the one surface of the wiring board.

9. The method for manufacturing a probe card according to claim 1, wherein each of the plurality of probes has, at a border between the probe main body portion and the attaching portion, a step abutting on an outer edge of a respective probe through hole of the probe substrate when the attaching portion is inserted into the respective probe through hole.

10. The method for manufacturing a probe card according to claim 1, wherein the probe main body portion of each of the plurality of probes is curved in a specified direction.

* * * * *